United States Patent [19]

Fischer

[11] Patent Number: 4,736,118
[45] Date of Patent: Apr. 5, 1988

[54] CIRCUIT ARRANGEMENT TO GENERATE SQUAREWAVE SIGNALS WITH CONSTANT DUTY CYCLE

[75] Inventor: Helmut Fischer, Munich, Fed. Rep. of Germany

[73] Assignee: Siemens Aktiengesellschaft, Berlin and Munich, Fed. Rep. of Germany

[21] Appl. No.: 935,080

[22] Filed: Nov. 24, 1986

Related U.S. Application Data

[63] Continuation of Ser. No. 636,752, Aug. 1, 1984, abandoned.

[51] Int. Cl.⁴ .................. H03K 3/017; H03K 5/22
[52] U.S. Cl. .................. 307/265; 307/234; 307/228; 307/355; 328/133; 328/58
[58] Field of Search .............. 307/265, 266, 267, 228, 307/355, 234, 529; 328/58, 55, 127, 155, 165, 133, 134

[56] References Cited

U.S. PATENT DOCUMENTS

| | | | |
|---|---|---|---|
| 3,753,012 | 8/1973 | Frederiksen et al. | 307/268 |
| 3,883,756 | 5/1975 | Dragon | 307/265 |
| 3,944,938 | 3/1976 | Brovant | 328/134 |
| 4,276,860 | 7/1981 | Caparka | 307/228 |
| 4,404,481 | 9/1983 | Ide et al. | 307/265 |
| 4,532,442 | 7/1985 | Black | 328/165 |
| 4,620,312 | 10/1986 | Yamashita | 307/265 |

FOREIGN PATENT DOCUMENTS 2425178 11/1979 France.
2019685 10/1979 United Kingdom.

Primary Examiner—Stanley D. Miller
Assistant Examiner—Timothy P. Callahan
Attorney, Agent, or Firm—Adel A. Ahmed

[57] ABSTRACT

The circuit arrangement generates square-wave signals whose recurrence frequency coincides with the recurrence frequency of input signals supplied to it and whose duty cycle is constant, irrespective of the recurrence frequency. The circuit arrangement contains a flip-flop set by each input signal and reset by reset signals. The square-wave signals are emitted at the output of the flip-flop. A first integrator circuit of relatively great time constant is discharged or charged when the flip-flop is set or reset, respectively. Another integrator circuit is charged whenever the flip-flop is set. The instantaneous voltages at outputs of integrator circuits are compared with each other, and when they are the same the comparator generates the reset signal. In addition, the second integrator circuit is discharged, and renewed charging is prevented as long as the flip-flop is reset.

4 Claims, 1 Drawing Sheet

CIRCUIT ARRANGEMENT TO GENERATE SQUAREWAVE SIGNALS WITH CONSTANT DUTY CYCLE

CROSS-REFERENCE

This is a continuation of Ser. No. 636,752 filed Aug. 4, 1984, abandoned.

BACKGROUND OF THE INVENTION

The invention relates to a circuit arrangement to generate square-wave signals in which the frequency of recurrence of the output square-wave signals coincides with the frequency of input signals and in which the square-wave signals have a duty cycle.

It is already known generally to generate square-wave signals which have the same recurrence frequency as input signals and a specified duty cycle. Such a circuit arrangement is disclosed, for example, in British Patent Application No. 2,019,685, which shows two capacitors coupled via a diode. The respective charging and discharging time constants of these capacitors are utilized to divide the time interval between two successive input pulses into two time periods of a given ratio of their duration. The first capacitor is discharged across a transistor switch directly controlled by the input signal. Therefore, the progress of the discharge process depends not only on the unavoidable discharge time constant, but also upon the length of the input signal. Furthermore, the time when the second capacitor turns from the discharge state to the charging state is determined by the voltage at the first capacitor during its subsequent charging as a function of the threshold voltage of the diode. This threshold voltage is, therefore, a direct tolerance factor of the circuit. Finally, although known circuit is adapted to follow the recurrence frequency variations of the input signal, it fails to control brief variations of the recurrence frequency (jitter).

In addition, it is also known to generate such square-wave signals by means of circuit arrangements having a monostable flip-flop as the input stage. This flip-flop is set by the input signals and resumes its reset position after a constant period of time. if the frequency of the input signals changes, the recurrence frequency of the square-wave signals also changes accordingly. However, since the time during which the monostable flip-flop is set is normally constant, the duty cycle will change if the frequency of the input signals changes.

A further development of this general circuit concept is disclosed in French Patent Application No. 2,425,178 which relates to a signal generator for an electronic ignition system, which is used to set the firing time for an internal combustion engine. Here, too, the problem arises, even though in connection with a totally different application, to provide, at a variable input signal frequency, an output signal of the same recurrence frequency and specified duty cycle. The flip-flop provided is set by the input signals, and by means of its output signals a capacitor is discharged at a specified first time constant until the discharge reaches a given threshold value. At this time a comparator starts to conduct and emits a reset signal for the flip-flop. The capacitor is then recharged with a given second time constant until the flip-flop is set again by the next input pulse.

At first glance, this circuit arrangement seems to meet all requirements for the present invention and, in the case of its application in electronic ignition systems, does work satisfactorily. But marginal conditions are present here which do not always prevail; it may be assumed that starting an engine always begins at a recurrence frequency near zero, the capacitor then also being charged to its maximum charge and that, overall, the recurrence frequency is relatively low (i.e. ranging up to several kHz). As the recurrence frequency of the input signals increases (i.e. with increasing engine speed) the output signal frequency then increases accordingly at approximately the same duty cycle.

But such favorable operating conditions do not often prevail (e.g. in servo clock motors for magnetic disc memories). In the application mentioned it must be assumed that the input signals are of much higher recurrence frequency, (in the MHz range) and—being of particularly aggravating effect—that relative to the automobile above application the operating condition changes suddenly. This means that as soon as input signals appear at all, they appear immediately at a relatively higher recurrence frequency which, however, also changes slowly—again in relation to the above application. In such an application the known circuit would not find sufficient time to center with respect to its fixed lower threshold value. Critical in the known circuit, therefore, is the initial state which restricts its application to more continually progressing control processes.

Also known generally are synchronizing circuits utilizing, for instance commercially available integrated circuits known as "phase locked loops". These synchronizing circuits generate square-wave signals coinciding with the input signals as to phase and frequency. But they are relatively expensive because they contain, for instance, an oscillator which generates the square-wave signals and whose recurrence frequency is varied as a function of the phase difference between the square-wave signals and the input signals.

SUMMARY OF THE INVENTION

It is one object of the invention to provide an improved circuit arrangement for the generation of square-wave signals whose recurrence frequency coincides with that of the input signals and whose duty cycle is constant. This circuit arrangement should also possess a high synchronizing capability, also in discontinuous operation, at particularly low cost, (i.e. it should have a stable starting behavior largely independent of the initial condition when starting).

In general, the invention features a circuit arrangement to generate square-wave signals in which the recurrence frequency of the square-wave signals coincides with the recurrence frequency of input signals and in which the square-wave signals have a specified duty cycle. The circuit includes a flip-flop which is set by each input signal, reset by each reset signal and emits at its output the square-wave signals; a first integrator circuit which is discharged and charged when the flip-flop is set and reset, respectively; a second integrator circuit which is charged whenever the flip-flop is set; and a comparator which generates the reset signal when the instantaneous voltages at the first and second integrator circuits are equal.

In preferred embodiments of the circuit arrangement the first integrator circuit is designed as a capacitor which, as a function of the binary values of the square-wave signals, is connected by means of a two position switch to a first or second power source for charging or discharging the capacitor; the second integrator circuit is designed as a capacitor with a parallel connected switch which is opened or closed when the flip-flop is set or reset, respectively; and the switch is designed as an integrated logic element in which the collector resistance of an output transistor is formed by the resistor of a power source charging the capacitor.

The circuit arrangement according to the invention is particularly distinguished in that a controlled response threshold is introduced, as realized by the first integrator circuit. This threshold, determining the comparator function, depends directly on the recurrence frequency and varies in accordance with the recurrence frequency variations. What this achieves is that the circuit arrangement recenters quickly also even if the recurrence frequency changes suddenly and that it continues to be synchronizable.

The circuit arrangement according to the invention has the further advantage that it can be built very inexpensively. Especially, it can be constructed inexpensively in the form of a thick film or thin film circuit. This circuit arrangement has a constant duty cycle over a relatively wide frequency range.

According to the invention, capacitors may be provided as first and second integrator circuits. Instead of the capacitors, it is also possible to provide counters which are counted up or down by counting cycles of constant recurrence frequency, or which are counted up and reset. The comparator may also be designed as a digital comparator so that the circuit arrangement can be made exclusively of integrated circuits.

Those skilled in the art will understand that changes can be made in the preferred embodiments here described, and that these embodiments can be used for other purposes. Such changes and uses are within the scope of the invention, which is limited only by the claims.

DETAILED DESCRIPTION

Figure 1:
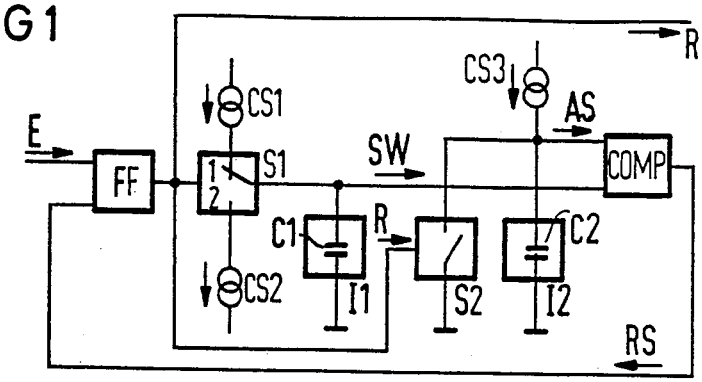
FIG. 1 shows a block wiring diagram of the circuit arrangement.

The circuit arrangement shown in FIG. 1 contains a flip-flop a FF, two position switch S1, integrator circuits I1 and I2a, switch S2, three current supplies CS1 through CS3 and a comparator K. The integrator circuits I1 and I2 are shown as comprising capacitors C1 and C2, respectively. Applied to a setting input of flip-flop FF are input signals E. Flip-flop FF then emits at its output the square-wave signals R.

Operational details of the circuit arrangement are described in the following, together with the time diagrams of FIG. 2.

Figure 2:
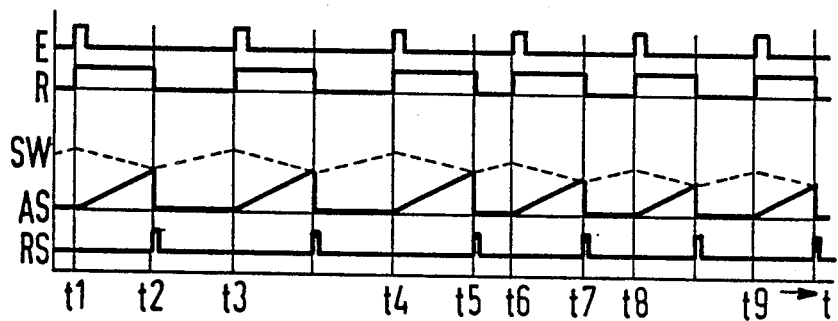
FIG. 2 shows time diagrams of signals at various points of the circuit arrangement.

In the time diagrams of FIG. 2 there are plotted in the abscissa direction the time t and in the ordinate direction instantaneous values of signals at various points of the circuit arrangement.

If at time t1 input signal E assumes the binary value "1", flip-flop FF is set. The square-wave signal R at its output assumes the binary value "1" and puts two-way switch S2 into position 2. Capacitor C1, having as its voltage the instantaneous value SW, is discharged through current supply CS2 with a relatively great time constant. At the same time, switch S2 is opened by square-wave signal R so that the capacitor C2 is charged by current supply CS3. This charging action takes place with a smaller time constant than the discharging of capacitor C1.

At time t2 comparator comp finds that the instantaneous value SW at capacitor C1 coincides with the instantaneous value AS and resets flip-flop FF with reset signal RS. This causes square-wave signal R to assume the binary value "0," so that two-way switch S1 is returned to position 1 and switch S2 is closed. Due to the closing of switch S2 the capacitor C2 is discharged immediately and kept in a discharged state. Capacitor C1, on the other hand, is charged with a relatively great time constant, using current supply CS1. At time t3 another input signal E appears so that flip-flop FF is set again with square-wave signal R resuming the binary value 1. Between the time t3 and t4 the same processes as between the times t1 and t3 are now repeated.

If charging and discharging occur symmetrically, the duty cycle of the square-wave signals R will be 1:2 (i.e. the pulse: interpulse ratio is 1:1). By varying current supplies CS1 and CS2 any duty cycle or pulse: interpulse ratio can be set. This duty cycle or pulse: interpulse ratio is always constant, regardless of the recurrence frequency of input signals E.

If the recurrence frequency of input signals E increases after time t4, the time between t5 and t4, during which capacitor C1 is discharged, is longer tha the length of time between t6 and t5, during which capacitor C1 is recharged, so that the voltage at capacitor C1 becomes smaller. Consequently, comparator COMP finds sooner, at time t7, the coincidence of the instantaneous values SW and A so that flip-flop FF is reset sooner and the same duty cycle reappears after a short transient period. Between times t8 and t9 processes similar to those between times t6 and t8 are repeated.

Figure 3:
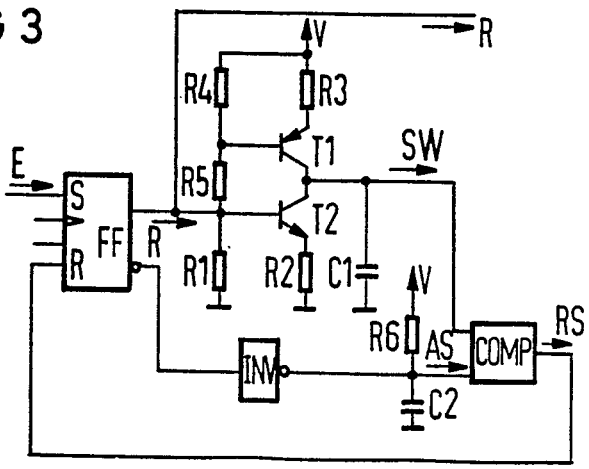
FIG. 3 shows a circuit diagram of one embodiment of the circuit arrangement.

In the embodiment of the circuit arrangement shown in FIG. 3, the square-wave signal R is emitted at the noninverting output of flip-flop FF. This flip-flop FF, like a gate INV, has an output whose output transistor has no collector resistance.

When the square-wave signal R has binary value "1" a transistor T2, together with resistors R1 and R2, forms a constant current source corresponding to current supply CS2 which discharges capacitor C1 serving as integrator circuit I1. When the square-wave signal R has binary value "0", a transistor T1, together with resistors R3 and R5, forms a constant current source corresponding to current supply CS1 which charges capacitor C1. Resistors R1 through R5 are designed so that the resultant discharge current of capacitor C1 is exactly the same as the charging current in the case where transistor T2 is turned off. Through the selection of the charging and discharging current and of the capacitance of capacitor C1 the dynamic readjustment behavior of the circuit arrangement can be determined with respect to an expected frequency variation of input signals E.

Another resistor R6 assumes the function of current supply CS3, and capacitor C2 acts as integrator circuit I2. Serving as switch S is inverter G which is connected as an integrated component to the inverting output of flip-flop F and which, as already mentioned, has no collector resistance either. The inverter discharges capacitor C2 and keeps it discharged as long as the square-wave signal R has the binary value "0".

The embodiment described illustrates the possibility of generating square-wave signals with a circuit arrangement constructed mostly of digital components, but also of some analog components. If the expected recurrence frequency of input signals E permits, the circuit arrangement may be constructed exclusively of digital components, however. In that case, integrator circuits I1 and I2 may each consist of a counter, driven by a clock of appropriate high frequency. The threshold SW corresponds to a given count. The comparator COMP then corresponds to a digital comparator which constantly compares the count indicated by the counter with the specified count. The switch S2, on the other hand, corresponds to the input of the counter with which the counter is reset to its initial value.

A circuit arrangement so designed has the advantage of being constructed entirely as an integrated circuit and of being adaptable to different conditions by simply varying the counting clock frequency.

There has thus been shown and described a circuit arrangement to generate square-wave signals which fulfils all the objects and advantages sought therefor. Many changes, modifications, variations and other uses and applications of the subject invention will, however, become apparent to those skilled in the art after considering the specification and the accompanying drawings which disclose embodiments thereof. All such changes, modifications, variations and other uses and applications which do not depart from the spirit and scope of the invention are deemed to be covered by the invention which is limited only by the claims which follow.

What is claimed is:

1. A circuit arrangement for providing at an output terminal a square wave signal having the same recurrence frequency as the recurrence frequency of an input signal and wherein said square wave signal exhibits a predetermined duty cycle, said circuit arrangement comprising:
    a flip-flop having set and reset states and having an output coupled to said output terminal for providing an output signal representative of said set and reset states, said set state being selected responsive to each recurrence of said input signal and said reset state being selected responsive to a reset signal;
    first controllable integrator circuit means having a control input coupled to said output terminal for providing a first ramp signal changing in first and second polarity directions during said set and reset states of said flip-flop, respectively;
    second controllable integrator circuit means having a control input coupled to said output terminal for providing a second ramp signal changing in said second and first polarity directions during said set and reset states of said flip-flop, respectively;
    a comparator having first and second inputs coupled to said first and second controllable integrator circuit means, respectively, and an output coupled to said flip-flop for providing thereto said reset signal responsive to said first and second ramp signals being substantially equal.

2. The circuit arrangement of claim 1, wherein said first controllable integrator circuit means includes:
    a first integrating capacitor for providing said first ramp signal thereacross; and
    first and second controllable current source means coupled to said first integrating capacitor for providing current thereto and having opposite polarities, said first and second controllable current sources being coupled to said output signal of said flip-flop and being responsive thereto for being enabled during said set and reset states of flip-flop, respectively.

3. The circuit arrangement of claim 2, wherein said second controllable integrator circuit means includes:
    a second integrating capacitor for providing said second ramp signal thereacross;
    third current source means coupled to said second capacitor for providing current thereto; and
    controllable switch means coupled in parallel with said capacitor and being coupled to said output of said flip-flop so as to be responsive to said output signal of said flip-flop for being substantially nonconductive and conductive during said set and reset states of said flip-flop, respectively.

4. The circuit arrangement of claim 3, wherein said switch means comprises an integrated circuit logic element including an output transistor having a collector resistance substantially determined by a resistance corresponding to one of said current source means, and being responsive to said set and reset states of said flip-flop.

* * * * *